United States Patent
Rosado et al.

(10) Patent No.: US 11,791,741 B2
(45) Date of Patent: Oct. 17, 2023

(54) POWER CONVERTER ASSEMBLIES WITH BUSBARS

(71) Applicant: Hamilton Sundstrand Corporation, Charlotte, NC (US)

(72) Inventors: Sebastian Rosado, Cork City (IE); Robert H. Dold, Monson, MA (US); Bo Liu, Vernon, CT (US); Xin Wu, Glastonbury, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 169 days.

(21) Appl. No.: 17/224,533

(22) Filed: Apr. 7, 2021

(65) Prior Publication Data
US 2021/0313900 A1 Oct. 7, 2021

Related U.S. Application Data

(60) Provisional application No. 63/006,657, filed on Apr. 7, 2020.

(51) Int. Cl.
*H02M 7/00* (2006.01)
*H01L 23/473* (2006.01)

(52) U.S. Cl.
CPC .......... *H02M 7/003* (2013.01); *H01L 23/473* (2013.01)

(58) Field of Classification Search
CPC ....... H02M 7/003; H01L 23/473; H05K 7/209
See application file for complete search history.

(56) References Cited

U.S. PATENT DOCUMENTS

| | | |
|---|---|---|
| 15,574,312 | 11/1996 | Bayerer et al. |
| 6,867,970 B2 | 3/2005 | Muller et al. |
| 7,881,086 B2 | 2/2011 | Nakayama et al. |
| 8,599,556 B2 | 12/2013 | Hentschel et al. |
| 9,413,114 B2 | 8/2016 | Yamkovoy |
| 9,538,680 B2 | 1/2017 | Li et al. |

(Continued)

FOREIGN PATENT DOCUMENTS

| | | |
|---|---|---|
| CN | 205725420 U | 11/2016 |
| EP | 614580 B1 | 3/1997 |

OTHER PUBLICATIONS

Extended European Search Report dated Sep. 2, 2021, issued during the prosecution of European Patent Application No. EP 21166985.8, 9 pages.

*Primary Examiner* — Adolf D Berhane
*Assistant Examiner* — Afework S Demisse
(74) *Attorney, Agent, or Firm* — Locke Lord LLP; Alicia J. Carroll; Gabrielle L. Gelozin

(57) ABSTRACT

A power converter assembly includes a semi-conductor module, a heat sink mechanically connected to the semi-conductor module, a first busbar assembly on a first side of the heat sink, and a second busbar assembly on a second side of the heat sink opposite from the first side. The first and second busbar assemblies are electrically connected to one another. A power converter assembly includes a plurality of sets of semi-conductor modules, a common heat sink mechanically connected to each semi-conductor module, a first busbar assembly on a first side of the common heat sink, and a second busbar assembly on a second side of the common heat sink opposite from the first side. The first and second busbar assemblies are electrically connected to one another.

20 Claims, 5 Drawing Sheets

(56) References Cited

U.S. PATENT DOCUMENTS

| | | |
|---|---|---|
| 2014/0062210 A1 | 3/2014 | Wagoner et al. |
| 2020/0006197 A1 | 1/2020 | Hart et al. |
| 2020/0084878 A1* | 3/2020 | Pando Rodriguez ........................ H05K 1/0216 |
| 2021/0297002 A1* | 9/2021 | Rosado ................. H02M 7/487 |
| 2022/0201892 A1* | 6/2022 | Bohländer ........... H02M 7/003 |

* cited by examiner

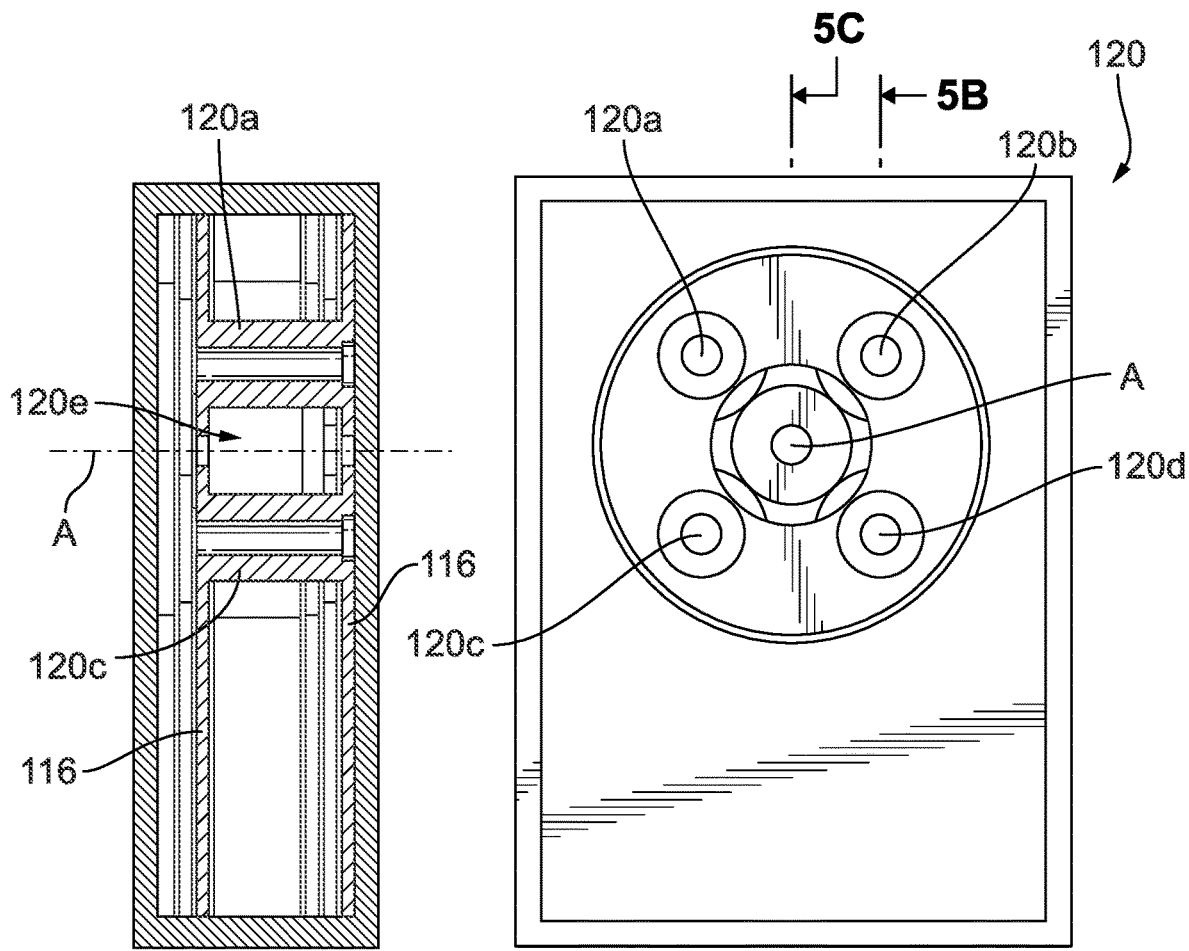
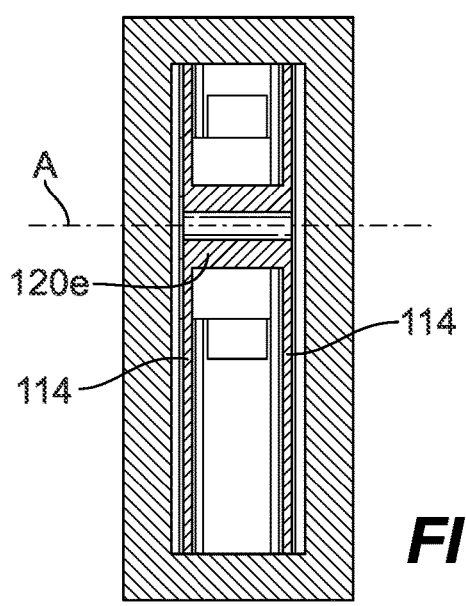
FIG. 5B
FIG. 5A
FIG. 5C

POWER CONVERTER ASSEMBLIES WITH BUSBARS

CROSS-REFERENCE TO RELATED APPLICATIONS

This application claims priority to and the benefit of U.S. Provisional Application No. 63/006,657, filed Apr. 7, 2020, the entire contents of which are herein incorporated by reference in their entirety.

BACKGROUND

Technological Field

The present disclosure relates to power electronics converters, and more particularly to a busbar connector for a DC-AC or AC-DC power controller.

Description of Related Art

Power converters require that the temperature of the components, especially semi-conductors, capacitors, and busbar, are kept under specified limits in order to achieve good reliability. In addition, parasitic inductance in the commutation path must be minimized in order to achieve the proper operation of the semi-conductors.

The conventional methods and systems have generally been considered satisfactory for their intended purpose. However, there is still a need in the art for assemblies that provide increased reliability and stability, and reduced size, weight, complexity, and/or cost. The present disclosure may provide a solution for at least one of these remaining challenges.

SUMMARY

A power converter assembly includes a semi-conductor module, a heat sink mechanically connected to the semi-conductor module, a first busbar assembly on a first side of the heat sink, and a second busbar assembly on a second side of the heat sink opposite from the first side. The first and second busbar assemblies are electrically connected to one another.

In some embodiments, the first busbar assembly includes a DC positive layer, a DC negative layer and a DC neutral layer. The second busbar assembly can include a DC positive layer, a DC negative layer and a DC neutral layer. The assembly can include a first capacitor on a first side of the heat sink and a second capacitor on the second side of the heat sink. The first and second busbar assemblies can each be connected to both the first capacitor and the second capacitor.

The assembly can include multiple phases, e.g. six phases, each phase can include one or more semi-conductor modules. For example, each phase can include two semi-conductor modules. A first set of semi-conductor modules can be on the first side of the heat sink and a second set of the semi-conductor modules can be on a second side of the heat sink. The assembly can include a first capacitor on a first side of the heat sink and a second capacitor on the second side of the heat sink. The first capacitor and the second capacitor can be electrically connected to both the first and second sets of semi-conductor modules. The first capacitor can be electrically connected to the first set of semi-conductor modules through the first busbar assembly. The second capacitor can be electrically connected to the second set of semi-conductor modules through the second busbar assembly.

The assembly can include a first AC connector electrically connected to the first set of semi-conductor modules and a second AC connector electrically connected to the second set of semi-conductor modules. The first set of semi-conductor modules can be electrically connected to the first busbar assembly. The second set of semi-conductor modules can be electrically connected to the second busbar assembly. The DC positive layer of the first busbar assembly can be electrically connected to the DC positive layer of the second busbar assembly. The DC negative layer of the first busbar assembly can be electrically connected to the DC negative layer of the second busbar assembly. The DC neutral layer of the first busbar assembly can be electrically connected to the DC neutral layer of the second busbar assembly.

The assembly can include three first AC connectors on the first side of the heat sink and three second AC connectors on the second side of the heat sink. The first and second busbar assemblies can be electrically connected to one another through the heat sink with a set of bushings. The set of bushings can include five bushings. Four of the bushings are periphery bushings and can be electrically connected to DC positive layers and/or the DC negative layers of the first busbar assembly and the second busbar assembly. A fifth of the five bushings can be a central bushing electrically connected to the DC neutral layers of the first busbar assembly and the second busbar assembly. The first, second, third and fourth bushings can have equivalent cross-sectional areas. The fifth bushing can have a cross-sectional area equal to the cross-sectional areas of the first and second bushing combined. The periphery bushings are equidistant from a longitudinal axis defined by the central bushing.

In accordance with another aspect, a power converter assembly includes a plurality of sets of semi-conductor modules, a common heat sink mechanically connected to each semi-conductor module, a first busbar assembly on a first side of the common heat sink, and a second busbar assembly on a second side of the common heat sink opposite from the first side. The first and second busbar assemblies are electrically connected to one another.

The first and second busbar assemblies can be similar to those described above. The assembly can include a plurality of first capacitors on a first side of the common heat sink and a plurality of second capacitors on the second side of the common heat sink. The first and second busbar assemblies can each be connected to both the plurality of first capacitors and the plurality of second capacitors. Each set of semi-conductor modules in each phase can include a plurality of semi-conductor modules. A first set of semi-conductor modules can be on the first side of the common heat sink and a second set of the semi-conductor modules can be on a second side of the common heat sink. Each semi-conductor module can include two semi-conductor switches. The assembly can include a first AC connector electrically connected to the first set of semi-conductor modules and a second AC connector electrically connected to the second set of semi-conductor modules.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein:

FIG. 5A is a top schematic view of a portion of the power converter assembly of FIG. 1, showing the bushing arrangement;

FIG. 5B is a cross-sectional schematic view of a portion of the power converter assembly of FIG. 1, showing the bushing connection between the first and second busbar assemblies; and FIG. 5C is a cross-sectional schematic view of a portion of the power converter assembly of FIG. 1, showing the center bushing connection in cross-section between the neutral layers of the first and second busbar assemblies.

DETAILED DESCRIPTION

Figure 1:
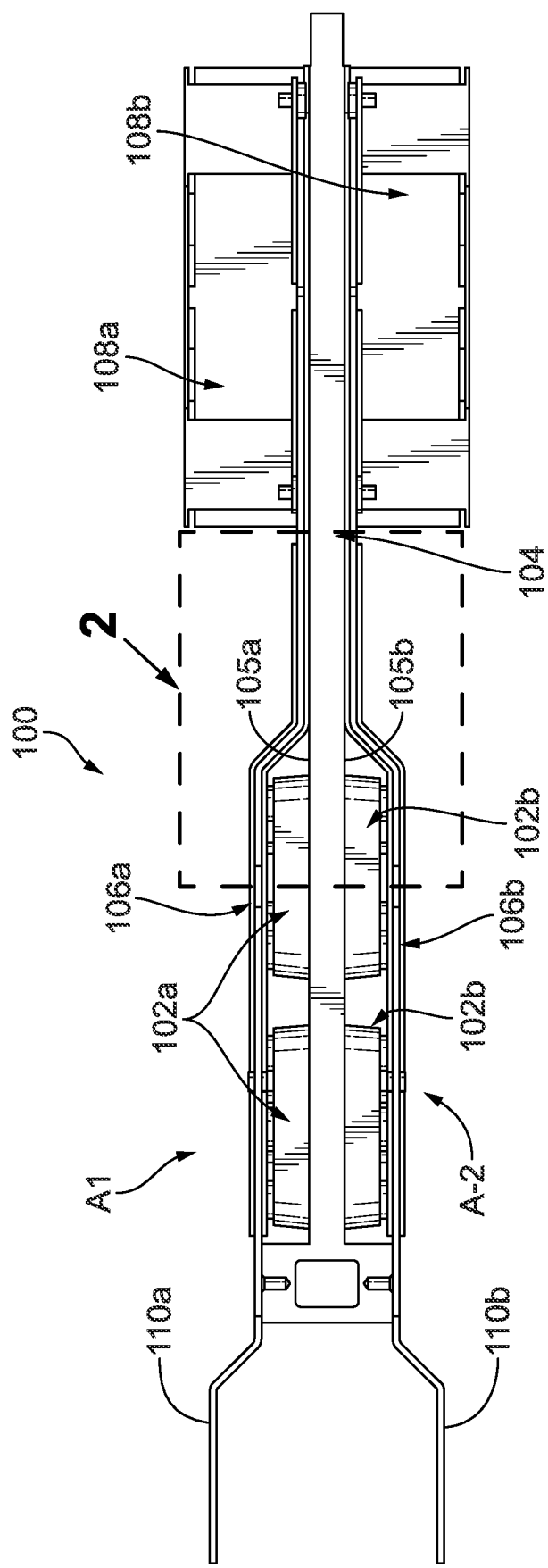
FIG. 1 is a schematic side view of a power converter assembly according to an embodiment of this disclosure, showing first and second busbar assemblies.

Reference will now be made to the drawings wherein like reference numerals identify similar structural features or aspects of the subject invention. For purposes of explanation and illustration, and not limitation, a partial view of an exemplary embodiment of a power converter assembly in accordance with the invention is shown in FIG. 1 and is designated generally by reference character 100. Other embodiments of the power converter assembly in accordance with the disclosure are provided in FIGS. 2-5C, as will be described. The methods and systems of the present disclosure provide a busbar geometry and overall power converter assembly that result in compact cooling for semiconductors and capacitors, and symmetry, thereby achieving a low parasitic inductance in the commutation loop. The power converter assembly structure of the present disclosure is very suitable for aerospace power electronic applications; or all type of applications requiring lightweight, compact power converters.

As shown in FIGS. 1-4, a power converter assembly 100 includes multiple phases, e.g. phases A1, B1, C1, A2, B2, and C2. Each phase includes a set of one or more semi-conductor modules, e.g. two semi-conductor modules. At least one of the top phases, e.g. one of phases A1, B1, C1, includes a first set 103a of two top semi-conductor modules 102a. At least one of the bottom phases, e.g. one of phases A2, B2, C2, includes a second set 103b of two bottom semi-conductor modules 102b. The assembly 100 includes a heat sink 104 mechanically connected to each semi-conductor module 102a and 102b. Heat sink 104 is a common heat sink 104, meaning that multiple phases (e.g. phases A1-C2) of the power converter electronics are part of a single assembly 100. Because power converter assembly 100 utilizes both sides of heat sink 104, the usage of available cooling is maximized, direct cooling of the busbars (described below) is enabled, and the capacitors, e.g. capacitors 108a and 108b, described below, are kept below temperature limits, thereby enabling increased life. The heat-sink 104 mechanically connects and refrigerates semi-conductor modules 102a and 102b and capacitors, e.g. capacitors 108a and 108b, described below.

As shown in FIGS. 1-4, the first set 103a of semi-conductor modules 102a is on the first side 105a of the heat sink 104 and a second set 103b of semi-conductor modules 102b is on a second side 105b of the heat sink 104. Each of the semi-conductor modules 102a and/or 102b includes two semi-conductor switches 107. Each switch 107 is shown with a single semi-conductor. However, it is contemplated that a given switch 107 can include multiple semiconductors. By having semi-conductor modules 102a and 102b on both sides of heat sink 104, power converter assembly 100 has a highly compact design that allows achieving high power density by using the two sides of the heat sink 104, e.g. a cold plate, to allocate for the heat generated in power semi-conductor switches 107.

As shown in FIG. 1, assembly 100 includes a first busbar assembly 106a on a first side 105a of the heat sink 104, and a second busbar assembly 106b on a second side 105b of the heat sink 104 opposite from the first side 105a. This busbar arrangement provides a compact design. The first and second bus bar assemblies 106a and 106b are cooled by the heat sink 104 in such a way that the capacitors, described below, are kept within their required thermal boundaries. The first set 103a of semi-conductor modules 102a are electrically connected to the first busbar assembly 106a. The second set 103b of semi-conductor modules 102b are electrically connected to the second busbar assembly 106b. The first and second busbar assemblies 106a and 106b, respectively, are electrically connected to one another through the heat sink 104 by way of two sets of bushings 119 and 119', which are described in more detail below. In this way, the busbar assemblies 106a and 106b connect the semi-conductor modules 102a and 102b on both sides of the heat sink 104.

Figure 2:
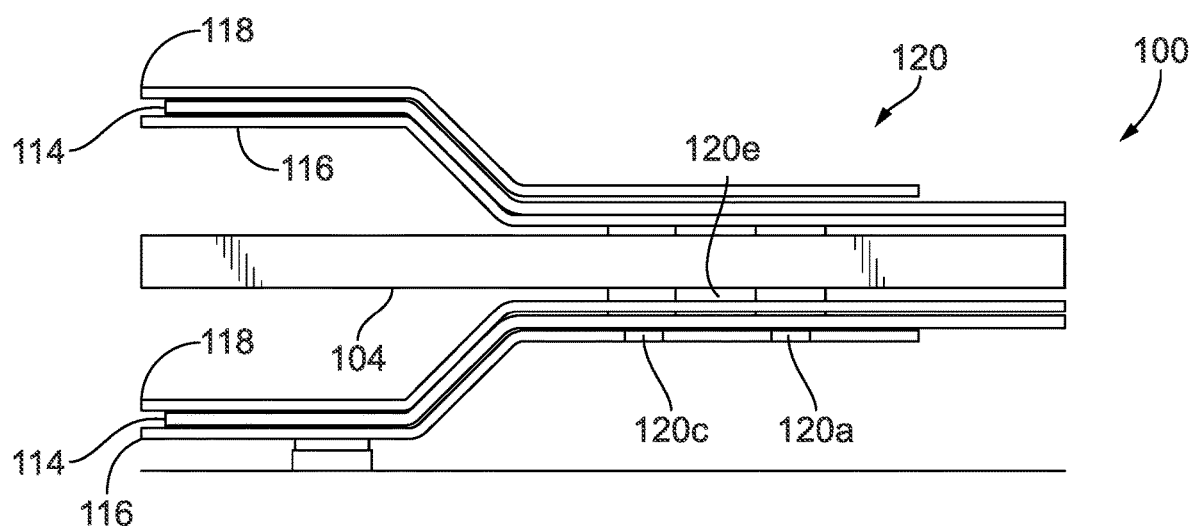
FIG. 2 is an enlarged schematic side view of the power converter assembly of FIG. 1, showing the layers of the busbar assemblies.
Figure 3:
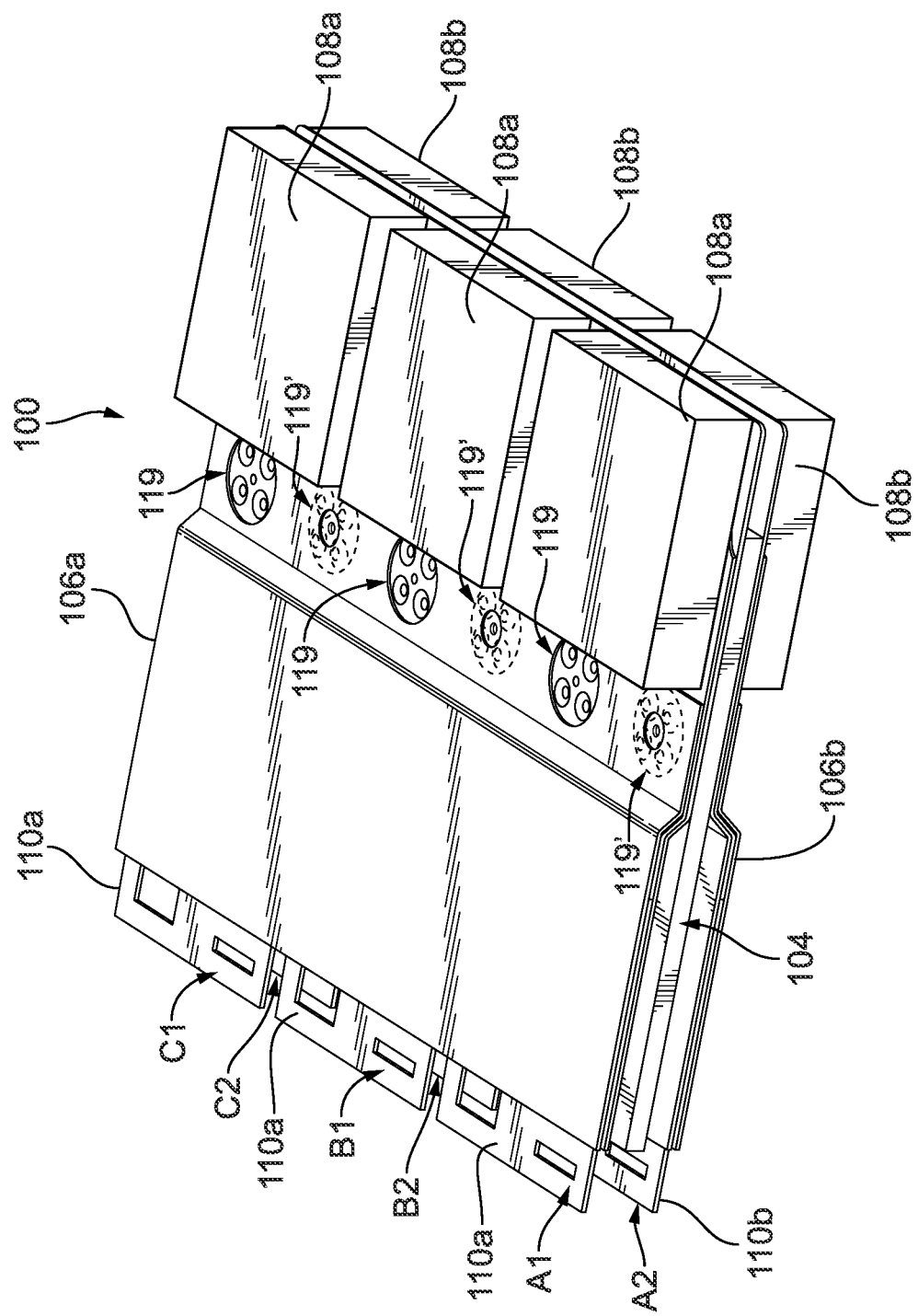
FIG. 3 is a schematic perspective view of the power converter assembly of FIG. 1, showing the capacitors.

As shown in FIGS. 1-3, the assembly 100 includes a plurality of first capacitors 108a, e.g. positive capacitors, on a first side 105a of the heat sink 104 and a plurality of second capacitors 108b, e.g. negative capacitors, on the second side 105b of the heat sink 104. The busbar assembly arrangement enables the integration of the capacitors 108a and 108b on busbar assemblies 106a and 106b, thereby reducing parasitic inductance and increasing the heat transmission out of the capacitors 108a and 108b. This capacitor distribution allows for even distribution of currents among commutating semi-conductor modules 102a and 102b, and for optimization of the total capacitance. Positive capacitors 108a and negative capacitors 108b all together form a DC link for power converter assembly 100 of a six-phase power converter. There could be different number of capacitors than phases, e.g. you could have a single positive capacitor 108a and a single negative capacitor 108b for all six phases A1-C2, or each phase could have a respective capacitor 108a or 108b, which is how it is depicted in FIG. 3. Because the DC link is split between the two sides of the heat sink 104, the semi-conductor modules 102a on the first side 105a must connect to the capacitors 108a and 108b on both sides of the heat-sink 104. To connect to the capacitors 108a and 108b on the opposite side of the heat sink 104, two sets of bushings 119 and 119' are used, where each set 119 and 119' has five bushings. The connection of the capacitors 108a and 108b across heat sink 104 allows reduction in the total amount of capacitance required for the complete converter assembly 100 because each half of the DC link, Cvdc/2+ (108a) and Cvdc/2- (108b), are shared by the two busbar assemblies 106a and 106b. Moreover, positioning capacitors 108a and 108b on opposing sides of the heat sink 104 achieves a compact design, high power density, and equal current sharing, but, in turn, it may increase the challenge in terms of achieving low parasitic inductance. DC busbar assemblies 106a and 106b connect the semi-conductor modules 102a and 102b to respective DC capacitors 108a and 108b (short time energy storage). In a given phase pair, e.g. A1 and A2, each busbar assembly 106a and 106b electrically connects to each of capacitors 108a and 108b.

Figure 4:
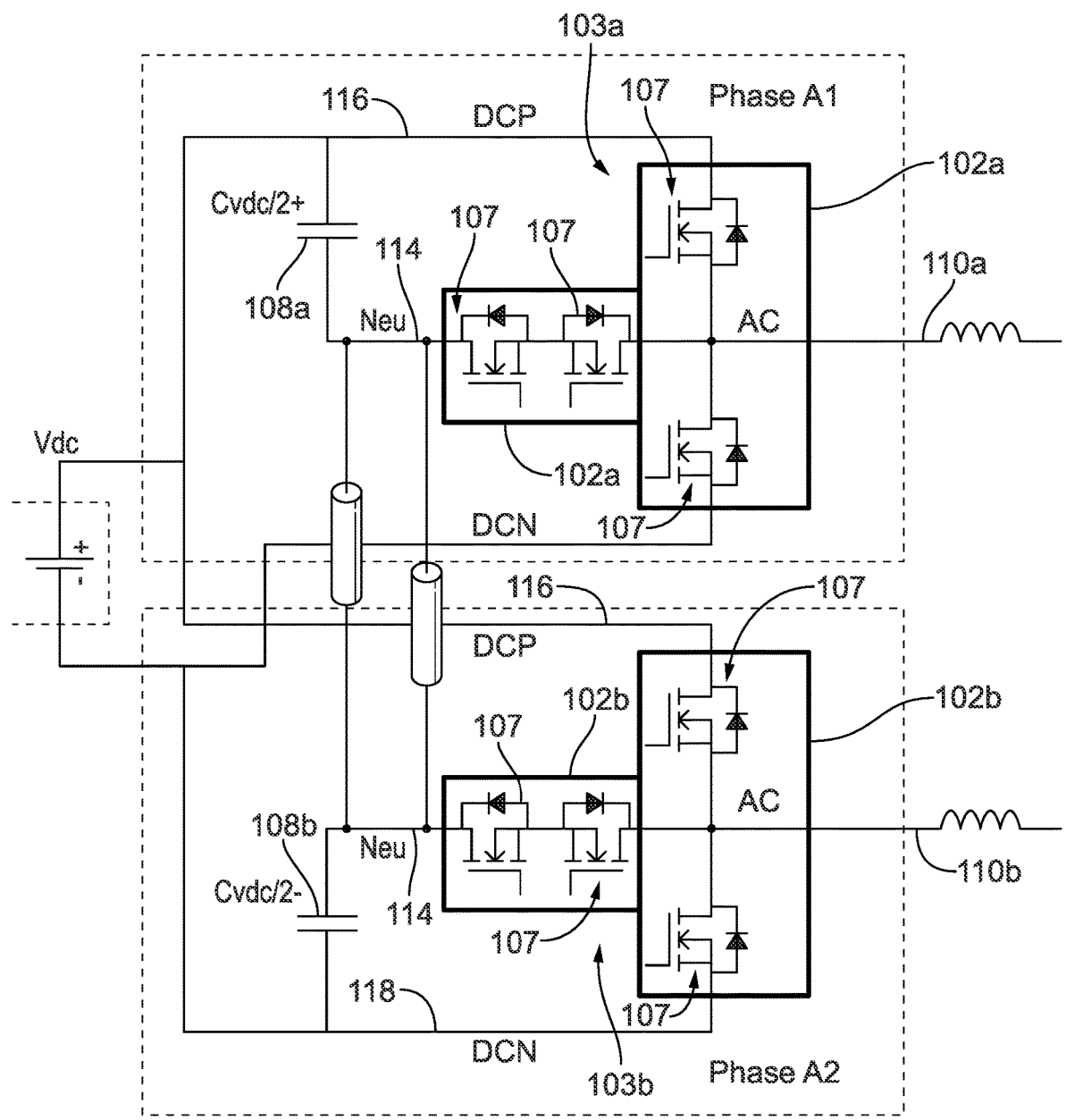
FIG. 4 is an electrical schematic for a portion of the power converter assembly of FIG. 1, showing the electrical components for a single phase.

As shown in FIGS. 2-4, first and second busbar assemblies 106a and 106b, respectively, each include a DC positive layer 116, a DC negative layer 118 and a DC neutral layer 114. In other words, the DC-link capacitors 108a and 108b are split in positive and negative sets. Assembly 100 includes at least a first capacitor 108a and at least a second capacitor 108b electrically connected to respective first and second sets of semi-conductor modules 102a and 102b. The first capacitor 108a is electrically connected to the first set 103a of semi-conductor modules 102a through the first busbar assembly 106a. The second capacitor 108b is electrically connected to the second set 103b of semi-conductor modules 102b through the second busbar assembly 106b. The assembly 100 results in a compact construction that allows high power density values, high electrical performance and enabling fast switching, wide band gap semiconductors.

With reference now to FIGS. 3-4, the assembly 100 includes a first AC connector, e.g. an AC input/output 110a, electrically connected to the first set 103a of semi-conductor modules 102a and a second AC connector, e.g. an AC input/output 110b, electrically connected to the second set 103b of semi-conductor modules 102b. The first AC input/output 110a, its respective semi-conductor modules 102a, and capacitors 108a, make up a single phase, e.g. phase A1, and the second AC input/output 110b, its respective semi-conductor modules 102b, and capacitors 108b, make up a single phase, e.g. phase A2, of a six phase power converter assembly 100. The six phases are schematically shown in FIG. 3. For six phase assembly 100, the assembly 100 includes three AC inputs/outputs 110a on the first side 105a of the heat sink 104 and three AC inputs/outputs 110b on the second side 105b of the heat sink 104. Heat sink 104 is common for all phases, while busbar assembly 106a is common to top phases A1, B1 and C1, and busbar assembly 106b is common to bottom phases A2, B2, and C2.

In FIG. 4, a circuit schematic showing the connection for two phases, A1 and A2, one phase located on the first side of the heat-sink and a second phase located on the second side of the heat-sink is provided. As shown in FIG. 4, the DC positive layer 116 of the first busbar assembly 106a is electrically connected to the DC positive layer 116 of the second busbar assembly 106b. The DC negative layer 118 of the first busbar assembly 106a is electrically connected to the DC negative layer 118 of the second busbar assembly 106b. The DC neutral layer 114 of the first busbar assembly 106a is electrically connected to the DC neutral layer 114 of the second busbar assembly 106b. Because the DC-link is split in half, e.g. a positive capacitor 108a on one side of the heat sink 104 and negative capacitor 108b on the other side, the semi-conductor modules 102a on one side must connect to the capacitors 108a and 108b on both sides of the heat-sink 104. To connect the semi-conductor modules 102a to the capacitors 108b on the opposite side of the heat sink 104, two sets of bushings 119 and 119' are placed connecting the busbar assemblies 106a and 106b. The first and second busbar assemblies 106a and 106b are electrically connected to one another through the heat sink 104 with each set of bushings 119 and 119', thereby also electrically connecting semi-conductor modules 102a and 102b to both the positive and negative capacitors 108a and 108b, respectively.

Each set of bushings 119 and 119' includes a set of five cylindrical bushings 120a-120e, and is used to connect either the positive or negative busbar layers 116 and 118, respectively. In order to minimize the parasitic inductance in the commutation loop it is convenient that this, either positive or negative conduction path, is physically close to a neutral conduction path. Therefore, each set of bushings 119 and 119' has the four peripheral cylindrical bushings 102a-d connecting either the positive or negative busbar layers 116 and 118, respectively, across the heat sink, and a central cylindrical bushing 102e connecting the opposing DC neutral layers 114 to one another. For a positive set of bushings 119, the cylindrical peripheral bushings 120a-d, are in electrical connection with DC positive busbar layers 116 of the first busbar assembly 106a and the second busbar assembly 106b, e.g. as shown in FIGS. 5A-5C. For a negative set of bushings 119', the cylindrical peripheral bushings 120a-d are electrically connected to DC negative busbar layers 118 of the first busbar assembly 106a and the second busbar assembly 106b. Those skilled in the art will readily appreciate that the connection for negative set of bushings 119' to negative busbar layers 118 would be depicted in a similar to the connection for the positive set of bushings 119 in FIG. 5B. For negative set of bushings 119', the cross-sectional view of FIG. 5B would be mirrored about an axis perpendicular to the axis A of FIG. 5B. In both cases, the fifth central bushing 120e is in electrical connection with DC neutral layers 114 of the first busbar assembly 106a and the second busbar assembly 106b. For each set of bushings 119 and 119', the first, second, third and fourth bushings 120a-120d have equivalent cross-sectional areas to one another, and the fifth bushing 120e has a cross-sectional area approximately equal to two-times the cross-sectional area of one of the bushings 120a-120d. The cross-sectional areas are the circular cross-sections taken in a plane perpendicular to the longitudinal axes of bushings 120a-d. For each set of bushings 119 and 119', bushings 120a-120d are positioned equidistant from longitudinal axis A of bushing 120e, such that bushings 120a-120d are positioned along a circle that is concentric with bushing 120e. The arrangement of bushings 120a-120e result in low parasitic inductance in the various commutation loops for all possible paths.

The methods and systems of the present disclosure, as described above and shown in the drawings, provide for an electrical converter assembly and aspects thereof with superior properties including increased reliability and stability, and reduced size, weight, complexity, and/or cost. While the apparatus and methods of the subject disclosure have been showing and described with reference to embodiments, those skilled in the art will readily appreciate that changes and/or modifications may be made thereto without departing from the spirit and score of the subject disclosure.

What is claimed is:
1. A power converter assembly, comprising:
a semi-conductor module;
a heat sink mechanically connected to the semi-conductor module;
a first busbar assembly on a first side of the heat sink; and
a second busbar assembly on a second side of the heat sink opposite from the first side, wherein the first and second busbar assemblies are electrically connected to one another,
wherein the first busbar assembly includes a DC positive layer, a DC negative layer and a DC neutral layer, wherein the second busbar assembly includes a DC positive layer, a DC negative layer and a DC neutral layer.

2. The assembly as recited in claim 1, further comprising a first capacitor on a first side of the heat sink and a second capacitor on the second side of the heat sink, wherein the first and second busbar assemblies are each connected to both the first capacitor and the second capacitor.

3. The assembly as recited in claim 1, wherein the semi-conductor module is one of a plurality of semi-conductor modules, wherein a first set of at least one of the plurality of semi-conductor modules are on the first side of the heat sink and a second set of at least one of a plurality of the semi-conductor modules are on a second side of the heat sink.

4. The assembly as recited in claim 3, further comprising a first capacitor on a first side of the heat sink and a second capacitor on the second side of the heat sink, wherein the first capacitor and the second capacitor are electrically connected to both the first and second sets of semi-conductor modules, wherein the first capacitor is electrically connected to the first set of semi-conductor modules through the first busbar assembly, and wherein the second capacitor is electrically connected to the second set of semi-conductor modules through the second busbar assembly.

5. The assembly as recited as in claim 3, further comprising a first AC connector electrically connected to the first set of semi-conductor modules and a second AC connector electrically connected to the second set of semi-conductor modules.

6. The assembly as recited in claim 3, wherein the first set of semi-conductor modules are electrically connected to the first busbar assembly.

7. The assembly as recited in claim 3, wherein the second set of semi-conductor modules are electrically connected to the second busbar assembly.

8. The assembly as recited in claim 1, wherein the second busbar assembly includes a DC positive layer, a DC negative layer and a DC neutral layer, wherein the DC positive layer of the first busbar assembly is electrically connected to the DC positive layer of the second busbar assembly, wherein the DC negative layer of the first busbar assembly is electrically connected to the DC negative layer of the second busbar assembly, wherein the DC neutral layer of the first busbar assembly is electrically connected to the DC neutral layer of the second busbar assembly.

9. The assembly as recited as in claim 1, further comprising three first AC connectors on the first side of the heat sink and three second AC connectors on the second side of the heat sink.

10. The assembly as recited as in claim 1, wherein the first and second busbar assemblies are electrically connected to one another through the heat sink with a set of bushings.

11. The assembly as recited in claim 10, wherein the set of bushings includes five bushings, wherein four of the five bushings are periphery bushings electrically connected to at least one of the DC positive layer or the DC negative layer of the first busbar assembly and the second busbar assembly, wherein a fifth of the five bushings is a central bushing electrically connected to the DC neutral layers of the first busbar assembly and the second busbar assembly, wherein the periphery bushings are equidistant from a longitudinal axis defined by the central bushing.

12. The assembly as recited in claim 10, wherein the set of bushings includes five bushings, wherein the first, second, third and fourth bushings have equivalent cross-sectional areas, wherein the fifth bushing has a cross-sectional area equal to the cross-sectional areas of the first and second bushing combined.

13. The assembly as recited in claim 1, wherein the DC positive layer, the DC negative layer and the DC neutral layer of the first busbar assembly are stacked such that the DC positive layer and the DC negative layer sandwich the DC neutral layer.

14. The assembly as recited in claim 1, wherein the DC positive layer, the DC negative layer and the DC neutral layer of the second busbar assembly are stacked such that the DC positive layer and the DC negative layer sandwich the DC neutral layer.

15. A power converter assembly, comprising:
a plurality of sets of semi-conductor modules;
a common heat sink mechanically connected to each semi-conductor module;
a first busbar assembly on a first side of the common heat sink; and
a second busbar assembly on a second side of the common heat sink opposite from the first side, wherein the first and second busbar assemblies are electrically connected to one another wherein the first busbar assembly includes a DC positive layer, a DC negative layer and a DC neutral layer, wherein the second busbar assembly includes a DC positive layer, a DC negative layer and a DC neutral layer.

16. The assembly as recited in claim 15, further comprising a plurality of first capacitors on a first side of the common heat sink and a plurality of second capacitors on the second side of the common heat sink, wherein the first and second busbar assemblies are each connected to both the plurality of first capacitors and the plurality of second capacitors.

17. The assembly as recited in claim 15, wherein each set of semi-conductor modules includes a plurality of semi-conductor modules, wherein a first set of semi-conductor modules are on the first side of the common heat sink and a second set of the semi-conductor modules are on a second side of the common heat sink, wherein each semi-conductor module includes two semi-conductor switches.

18. The assembly as recited as in claim 17, further comprising a first AC connector electrically connected to the first set of semi-conductor modules and a second AC connector electrically connected to the second set of semi-conductor modules.

19. The assembly as recited in claim 15, wherein the DC positive layer, the DC negative layer and the DC neutral layer of the first busbar assembly are stacked such that the DC positive layer and the DC negative layer sandwich the DC neutral layer.

20. The assembly as recited in claim 15, wherein the DC positive layer, the DC negative layer and the DC neutral layer of the first busbar assembly are stacked such that the DC positive layer and the DC negative layer sandwich the DC neutral layer.

* * * * *